(12) United States Patent  (10) Patent No.: US 7,977,718 B2
Hannebauer  (45) Date of Patent: Jul. 12, 2011

(54) IMAGE SENSOR PHOTODIODES USING A MULTI-LAYER SUBSTRATE AND CONTACT METHOD AND STRUCTURE THEREOF

(75) Inventor: Robert Steven Hannebauer, Vancouver (CA)

(73) Assignees: Lumiense Photonics, Inc., Vancouver (CA); Hanvision Co., Ltd., Daejeon-Si (KR)

( * ) Notice: Subject to any disclaimer, the term of this patent is extended or adjusted under 35 U.S.C. 154(b) by 0 days.

(21) Appl. No.: 12/686,977

(22) Filed: Jan. 13, 2010

(65) Prior Publication Data

US 2010/0109117 A1   May 6, 2010

Related U.S. Application Data

(60) Continuation of application No. PCT/KR2006/003625, filed on Sep. 12, 2006, and a division of application No. 12/045,960, filed on Mar. 11, 2008, now Pat. No. 7,838,318.

(30) Foreign Application Priority Data

Sep. 13, 2005  (KR) .................. 10-2005-0085417
May 10, 2006  (KR) .................. 10-2006-0042002

(51) Int. Cl.
*H01L 31/113*  (2006.01)

(52) U.S. Cl. ........ 257/292; 257/252; 257/290; 257/291; 257/293; 257/E21.347; 257/E27.133

(58) Field of Classification Search .............. 257/290, 257/291, 292, 293, 252, E21.347, E27.133
See application file for complete search history.

(56) References Cited

U.S. PATENT DOCUMENTS

| 7,465,592 | B2 * | 12/2008 | Yoo ................... 438/22 |
| 7,608,906 | B2 * | 10/2009 | Tennant ................ 257/461 |
| 2007/0145246 | A1 * | 6/2007 | Roy et al. ............ 250/214.1 |
| 2007/0187787 | A1 * | 8/2007 | Ackerson et al. ....... 257/428 |

FOREIGN PATENT DOCUMENTS

| JP | 2004-221506 | 8/2004 |
| JP | 2005-158834 | 6/2005 |
| KR | 2002-17786 | 3/2002 |
| KR | 2004-95182 | 11/2004 |

OTHER PUBLICATIONS

International Search Report from PCT/KR2006/003625.

* cited by examiner

*Primary Examiner* — Long K Tran

(74) *Attorney, Agent, or Firm* — Brinks Hofer Gilson & Lione

(57) ABSTRACT

The present invention relates to a photodiode of an image sensor using a three-dimensional multi-layer substrate, and more particularly, to a method of implementing a buried type photodiode and a structure thereof, and a trench contact method for connecting a photodiode in a multi-layer substrate and a transistor for signal detection.

5 Claims, 10 Drawing Sheets

IMAGE SENSOR PHOTODIODES USING A MULTI-LAYER SUBSTRATE AND CONTACT METHOD AND STRUCTURE THEREOF

CROSS-REFERENCE TO RELATED APPLICATIONS

This application is a divisional of U.S. application Ser. No. 12/045,960, filed on Mar. 11, 2008. The disclosure of the above application is incorporated herein by reference.

FIELD

The present invention relates to photodiodes in an image sensor using a three-dimensional multi-layer substrate, and more particularly, to pixel separation and contact methods in a multi-layer substrate and a photodiode structure, in which noise in the photodiode can be reduced substantially or eliminated.

BACKGROUND

The statements in this section merely provide background information related to the present disclosure and may not constitute prior art.

In the field of image sensors or optical sensors, a variety of techniques using a sensor capable of sensing photons having an infrared, visible or wide spectrum have been developed. However, none of these techniques are used in the mass production of imager devices with a three-dimensional multi-layer structure.

The reason for this is that each technique falls short in production use for layered sensors, is: 1) a reduction in fill factor due to the existence of signal processing and transfer circuits taking up space in the pixel; 2) that light having a variety of wavelengths is not sensed at a single pixel location, 3) optimization of a wavelength selection filter that is integrated into a device and can select specific spectra only all at one pixel location, 4) leakage current reduction; and finally 4) kTC noise reduction.

A sensor having three or more layered photodiodes can convert the whole of the incident light into image information like photographic film. A previous report by Wolfenbuttel showed the existence of such a sensor in which depth of absorption is different depending on wavelength in a silicon layer and thus depth could be used to classify the color of the incoming light. Furthermore, in other reports, a selective epitaxial growth method was used. In still another reports, an effort was made to obtain the same effect by controlling the depletion depth of amorphous silicon by changing operating bias and thereby controlling the depth from which photo generated charge is collected.

All the techniques have not been successfully commercialized as stated in their reports. A company who has developed such concept into mass-production is Foveon Inc: Foveon used a three-layered photodiode structure with collection at various depths as per the Wolfenbuttel scheme. However, Foveon's method has three problems in obtaining the above stated advantages.

First, a laminated diode structure cannot be formed with a "pinned" structure. Therefore, a problem arises because noise cannot be reduced.

Second, there is a problem in that a wide filtering curve provided by silicon amplifies any noise in a color correction step.

Third, Foveon's sensor has a fill factor lower than that of a CMOS APS sensor, and even that of an ILT CCD sensor.

SUMMARY

Disclosure of Invention Technical Problem

An object of the present invention is to solve the issue of sensor readout noise of a photodiode in a photo image sensor using a multi-layer substrate.

Another object of the present invention is to provide inter-pixel isolation and contact methods of a multi-layer structure and a structure thereof in a photo image sensor using a three-dimensional multi-layer substrate by thin film transfer.

Another object of the present invention is to provide a photodiode that can be layered, has a low leakage current, can have a buried and pinned structure, and has a high fill factor.

Further another object of the present invention is to provide a multilayer three dimensional sensor that can be back-side illuminated.

Technical Solution

The present invention provides a back illuminated image sensor fabricated by forming photodiodes and transistors of a multi-layer substrate using layer transfer technology, wherein a method of forming the photodiode includes the steps of sequentially forming a P-N-P layer on a substrate and forming an oxide film on the surface; forming a nitride film on the oxide film, etching the nitride film through patterning, and etching the P-N-P layer and a part of the substrate by etching of the oxide film and silicon, thus forming an isolation type trench groove; forming a sidewall oxide film on etched sidewalls of the P-N-P layer; implanting a trivalent element into the sidewalls of the groove in which the sidewall oxide film is formed, thus forming a P sidewall layer to which the upper and lower P layers of the P-N-P layer are connected within the sidewall oxide film; filling the isolation type trench groove with an insulating material; and performing a thermal treatment process to form a pinned and buried type of photodiode.

The photodiode may be formed by forming a P-N-P layer instead of the N-P-N layer, forming the sidewall oxide film, and then forming an N sidewall layer connected to upper/lower N layers of the N-P-N layer by P implant.

In the above-mentioned N-P-N or P-N-P photodiode structure, once a thermal treatment (drive-in) process is subsequently performed, and the doping levels are appropriate then depletion occurs in the central collection region of the photodiode center (P of N-P-N or N of P-N-P), thereby forming a pinned structure. The fact that the central portion is surrounded by material of opposite doping means that the photodiode is also buried and the charge collection region is kept away from the Si/SiO2 interface.

Furthermore, according to the present invention, after a semiconductor of a multi-layer structure is formed, a contact for connecting photodiodes and transistors of each layer is contacted by forming trench grooves. A contact formation method includes forming contact type trench grooves up to a desired layer through trench drilling, forming a contact by implant for forming the contact, and forming a sidewall oxide film on the sidewalls of etched contact type trench grooves.

Furthermore, an embodiment of the present invention provides a method of fabricating a back illuminated photo image sensor having a multi-layer structure by laminating transistor layers on blue, green, and red photodiode layers.

In order to contact diodes laminated on the transistor layers to a metal line, trench grooves are drilled up to a desired portion and a sidewall oxide film is formed. A contact is then formed on a layer contacting a bottom surface of a groove by ion implant.

A semiconductor substrate can be formed by modifying the basic concept of layer transfer technology in order to meet the object of the present invention. A work substrate in which there is no pattern or topology is used. But this is not a fundamental limitation someone skilled in the art would readily see that patterned implants, trenches and other structures could easily be facilitated within the limits of aligning technologies.

According to an embodiment of the present invention, there is provided a pixel isolation and contact structure of a photodiode of a three-dimensional multi-layer image sensor in which a first conductive material, a second conductive material, and a first conductive material are sequentially doped into silicon, forming one photodiode layer, the photodiode layer comprises one or more layers, of the multilayer and a transistor layer is formed at the highest layer or the lowest layer. The pixel isolation and contact structure includes an isolation type trench groove formed for pixel isolation; a plurality of contact type trench grooves respectively formed to a predetermined depth in order to connect circuits of photodiodes of each layer and the transistor layer; a sidewall insulating layer formed on sidewalls of the isolation type trench grooves and the contact type trench grooves; a first conductive material sidewall layer formed within the sidewall insulating layer and having a structure in which the upper and lower first conductive materials are interconnected to bury the middle second conductive material; an insulating layer filled into the isolation type trench groove; a contact doped on a bottom surface of the contact type trench groove, for electrical connection with a corresponding photodiode; a conductive material filled into the contact type trench grooves; and a photodiode of a pinned structure formed in both directions of the second conductive material through a thermal treatment process.

The first conductive material may be a P type or N type material and the second conductive material may be an N type or P type material complementary to the first conductive material.

The insulating layer may be formed of an oxide film.

Furthermore, according to the present invention, the multilayer photodiode layer may be laminated in a structure in which a P-N-P type or an N-P-N type are mixed.

In the process according to the present invention, general silicon processing techniques, equipments, and factories are employed without special equipment. This enables each process to be optimized and performed independently. This is because the formation of photodiodes, the connection and contact of photodiodes, a transistor process, and a metal stack process do not affect the other they are independent of each other.

The sensor according to the present invention depends on SOI wafer fabrication technique. However, there is an advantage in that all standard CMOS Front End Of Line (FEOL) processes can be used.

Advantageous Effects

In accordance with the present invention, a diode layer and a transistor layer are laminated by layer transfer and a photodiode for an image sensor is formed. Therefore, the present invention is advantageous in that it can provide a photodiode that can be laminated, has a low leakage current, can have a buried and pinned structure, and has a high fill factor.

Furthermore, a multiple wavelength selective image sensor according to the present invention is advantageous in that it can detect several wavelength bands at one pixel location, can control wavelength bands individually, can minimize the leakage current at an optical detection location, can eliminate kTC noise, can optimize the fill factor of individually sensed pixel, and can maximize an area for implementing a signal processing circuit.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

In order that the invention may be well understood, there will now be described an embodiment thereof, given by way of example, reference being made to the accompanying drawing, in which.

Figure 16:
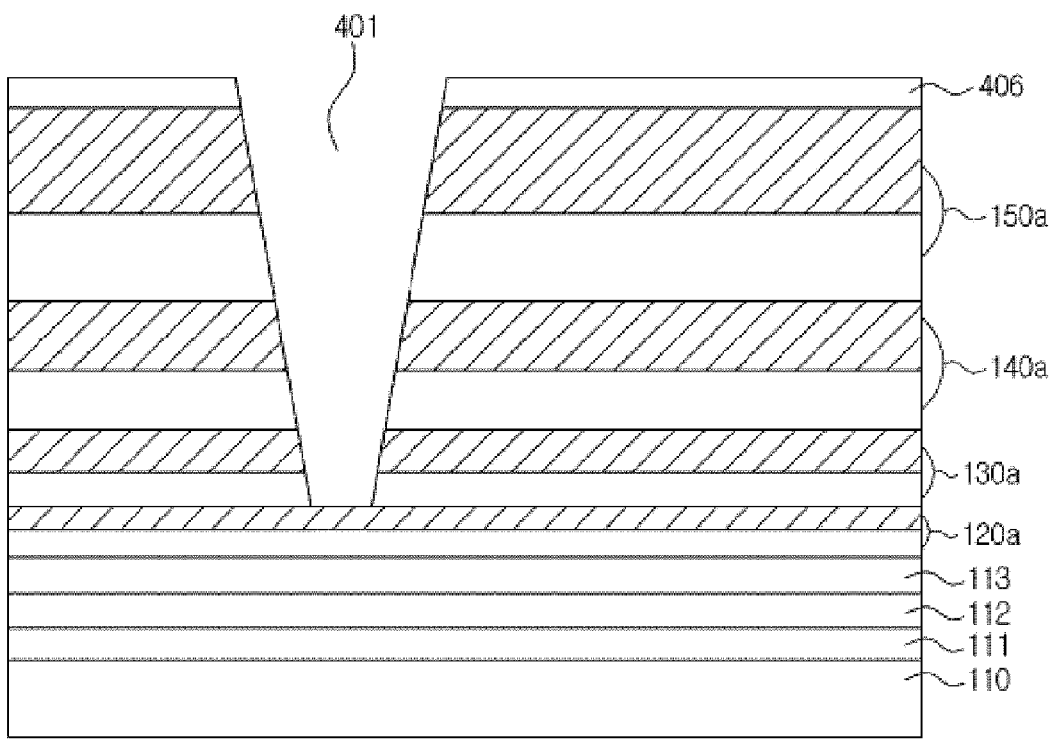
Figure 17:
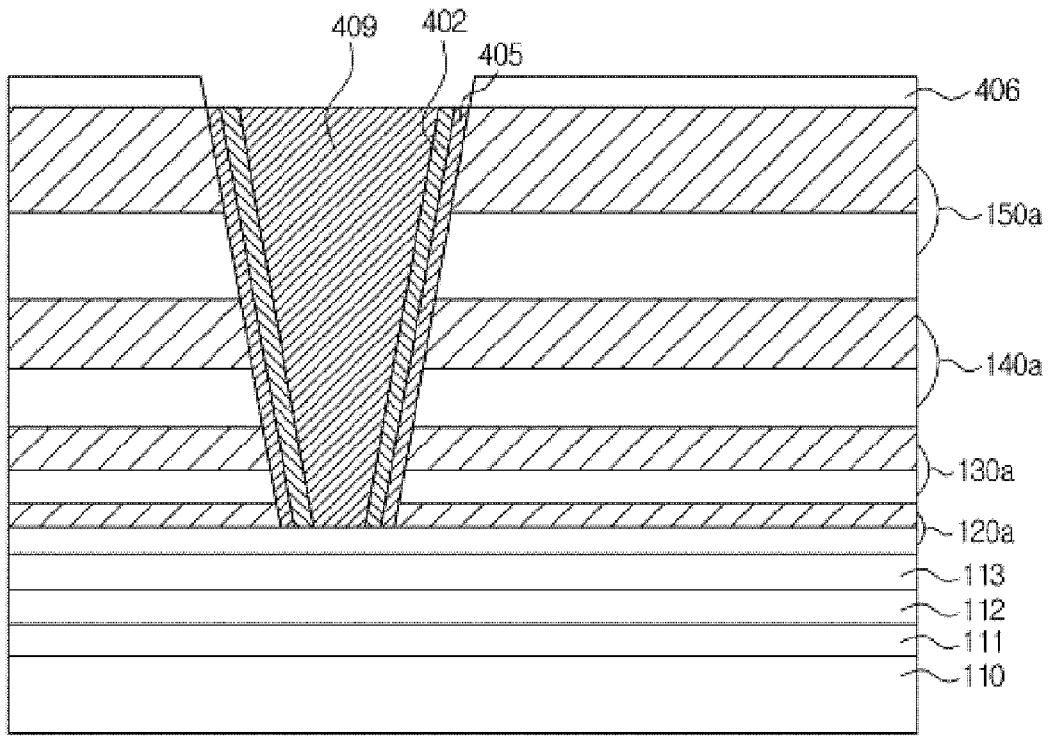
Figure 18:
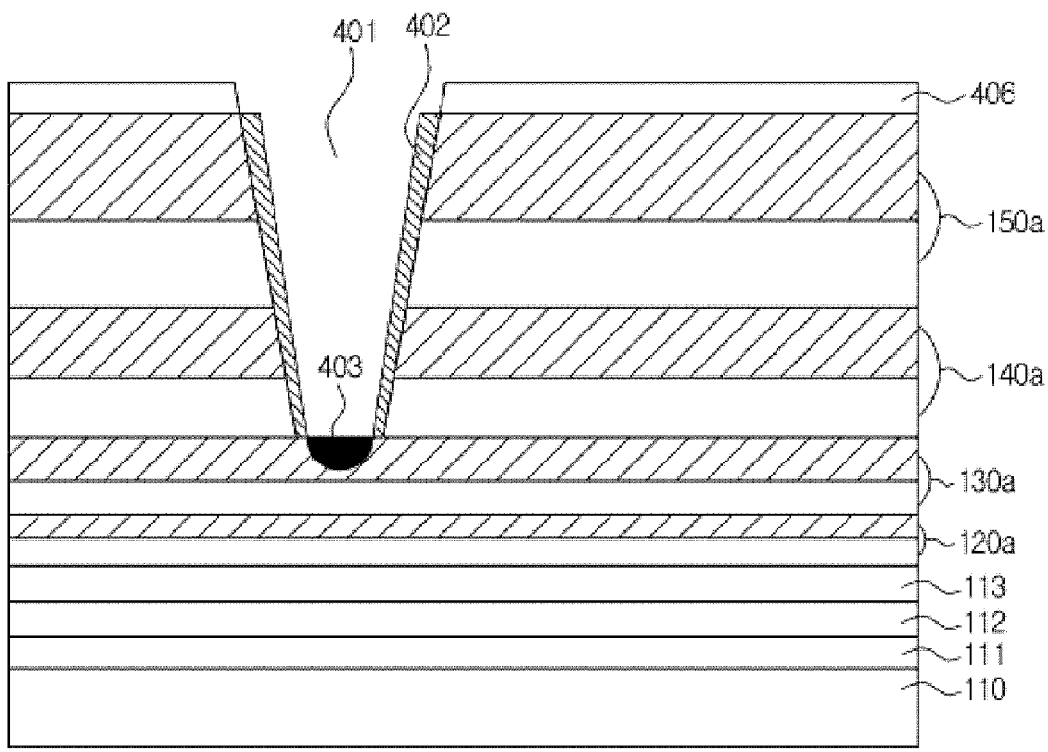
Figure 19:
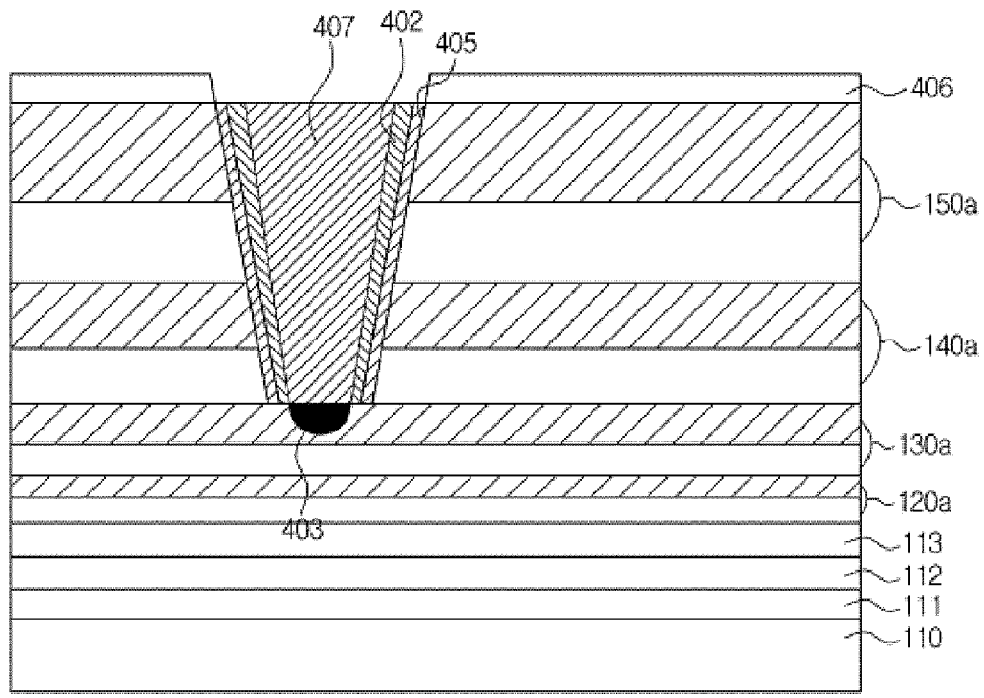
Figure 20:
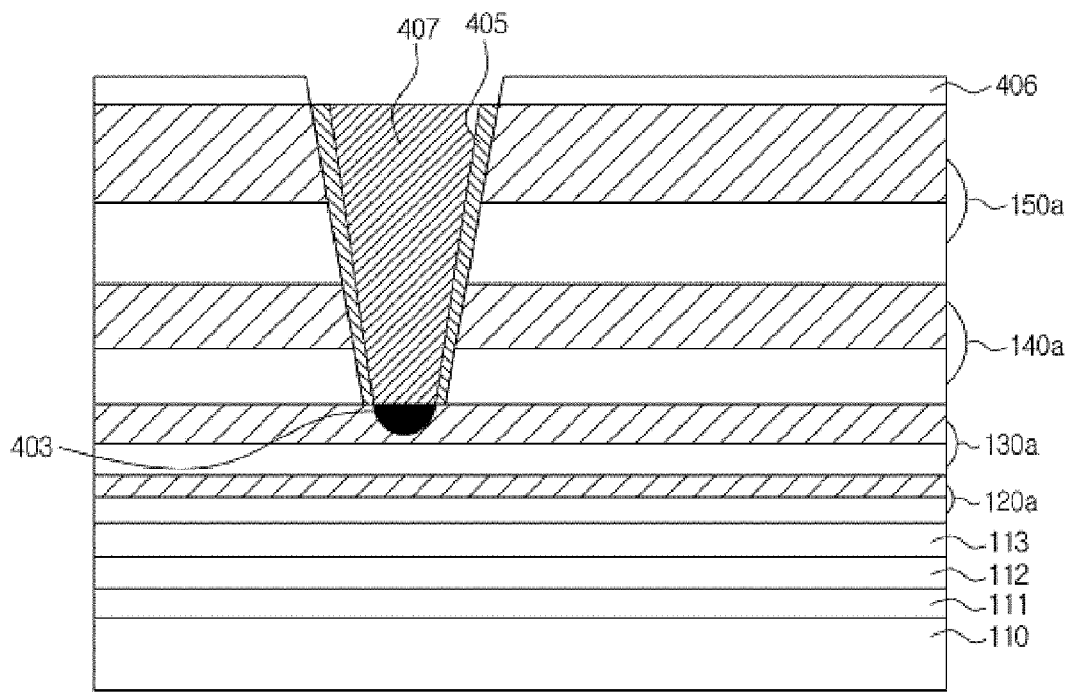

FIGS. 14 to 17 are explanatory views illustrating a pixel isolation process of a photodiode of a three-dimensional multi-layer structure image sensor according to an embodiment of the present invention; and FIGS. 18 to 20 are explanatory views illustrating a contact process of a photodiode of a three-dimensional multi-layer structure image sensor according to an embodiment of the present invention.

DETAILED DESCRIPTION

The following description is merely exemplary in nature and is not intended to limit the present disclosure, application, or uses.

Figure 1:
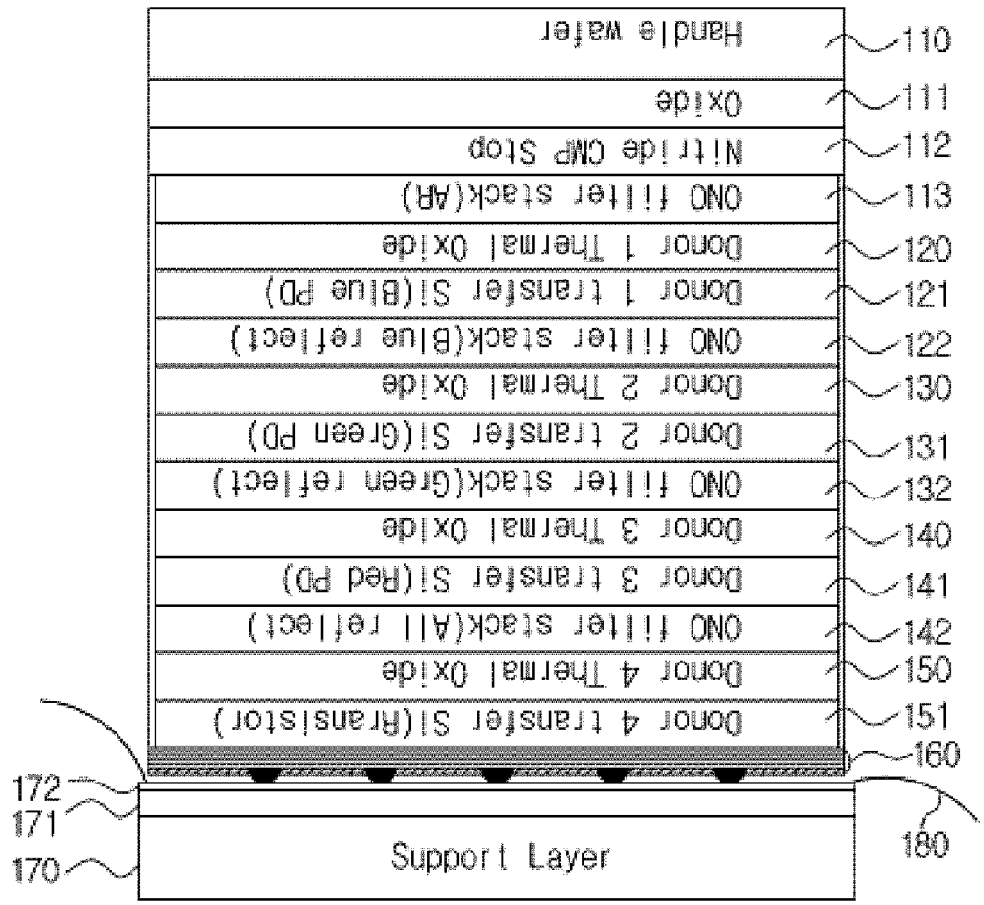
FIG. 1 is a schematic cross-sectional view of a back illuminated image sensor using a multi-layer substrate according to an embodiment of the present invention.

FIG. 1 is a schematic cross-sectional view of a three-dimensional multi-layer type photo image sensor to which the present invention is applied. This cross section is taken part way through the process before the handle wafer is removed for illustrative purposes.

Referring to FIG. 1, a buffer oxide film 111, a nitride film 112, and an ONO filter stack (AR) layer 113 are sequentially formed on a handle wafer 110. A blue photodiode 121 is formed in a donor wafer with the blue photodiode 121 and the screen oxide from implant 121 being the remaining parts in this picture that have been transferred from the donor wafer. The donor wafer is bonded to a top surface of the handle wafer 110. Therefore, layer transfer in which a silicon layer of the donor wafer 121 and associated oxide 120 is separated by transfer is performed.

Thereafter, an ONO filter stack (blue reflect) layer 122 is formed on a top surface of the blue photodiode 121. The donor wafer is again prepared and a photodiode layer is formed with subsequent screen oxide layer. Another layer transfer process is then performed as before. This process is repeated with varying thickness of silicon transferred and varying thicknesses of dielectric stack being formed for different filtering characteristics. A green photodiode layer 131, a red photodiode layer 141, and a transistor layer 151 are formed in turn on a blue photodiode layer 121 using the same process as that of forming a dielectric layer, silicon layer and layer transfer.

After the above-mentioned process is performed, a three-layered ILD, metal layer, and BEOL layer (hereinafter, referred to as "metal layer") 160 are formed on the transistor layer 151. A contact process of respective photodiodes and transistors, a pixel isolation process, etc. are carried out and solder bumpers 161 are formed.

A support layer 170 is prepared. A dielectric insulation film 171 and a patterned metal layer 172 are formed on the support layer 170. The support layer 170 is aligned and bonded to the solder bump 161. A sealing process for protecting the space between dies upon dicing is performed.

The support layer 170 is turned over so that it is located on a lower side. The handle wafer is removed through CMP, grinding and etch processes until the etch stop nitride film is reached. The nitride film 112 is etched using oxide 111 as an etch-stop layer, thus removing all remnants of the handle wafer and allowing for backside illumination.

Thereafter, dicing for separating the elements is performed and wire bonding is performed, thus completing an image sensor.

As described above, the device of the multi-layer structure is formed by laminating the blue, green, and red diode layers and the transistor layer. The elements are formed so that the device can be used with it being turned over, fabricating the back illuminated image sensor. A process of forming a photodiode will be described below.

<Formation of Buried Type Photodiode>

One of the objects of the present invention is to provide a photodiode that can be laminated and stacked, has a low leakage current, can have a buried and pinned structure, and has a high fill factor.

One of the most important characteristics of a buried photodiode is a low leakage current characteristic. A photodiode having a dielectric insulation structure has a tendency to have its leakage current characteristic dominated by Si—$SiO_2$ interface and the surface traps from this interface. This corresponds to a flicker-noise type leakage current.

In the process according to the present invention, only one junction surface exists, and this PN junction is beneath the surface of the diode away from the Si—SiO2 interface. Accordingly, in the buried photodiode according to the present invention, the leakage current can be reduced significantly and characteristics of the leakage current can be changed. Furthermore, since the photodiode implant can be independently controlled a pinned photodiode structure can be formed; kTC noise can be reduced significantly.

<Formation of Trench Contact>

A technique required to connect a transistor and a photodiode is a trench contact method. This technique is one used to form a capacitor at a small area in DRAM, etc. and is generally a formation technique of a trench capacitor.

In the present invention, a connection path is formed using a trench drilling technique. A conductor, such as metal, is inserted into the connection path through deposition, thus connecting a transistor detection circuit and a photodiode. To this end, there is a need for a high aspect ratio upon trench drilling. If the trench is too wide, a worthy fill factor will become small.

If a material has a uniform property, a typical side aspect ratio is 40:1. This means that a trench of 100 nm in width can be formed using a trench technique of a modified SH trench technique or DRAM fabrication technique.

To improve the fill factor of a blue color, it is not necessary to form a trench for insulation at the last layer. This is because junction insulation is sufficient.

<Example of Buried Type Photodiode>

In an assembly process of a substrate, a photo sensing region is buried within an external region contacting a buried oxide film. However, if a diode is cut and isolated for pixel isolation, a photodiode region is exposed to an oxide film edge along the sides of the trench cut.

FIGS. 2 to 7 illustrate a method of processing an exposed portion of an oxide film edge of a photodiode.

Figure 2:
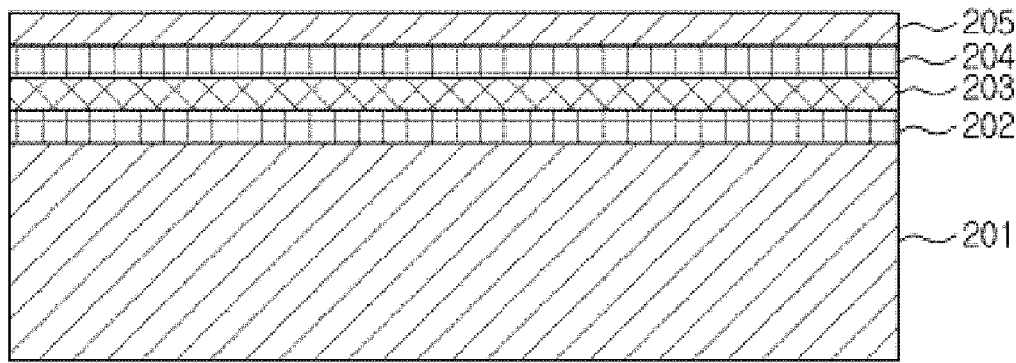
FIGS. 2 to 7 are cross-sectional views illustrating a method of fabricating a P-N-P type photodiode according to an embodiment of the present invention.

Referring first to FIG. 2, a P-type layer 202, a N-type layer 203, and a P-type layer 204 are sequentially formed on a substrate (SiO2) 201 (i.e., the BOX, buried Oxide, of a SOI base material). An oxide film 205 is formed on the P-type layer 204.

Figure 3:
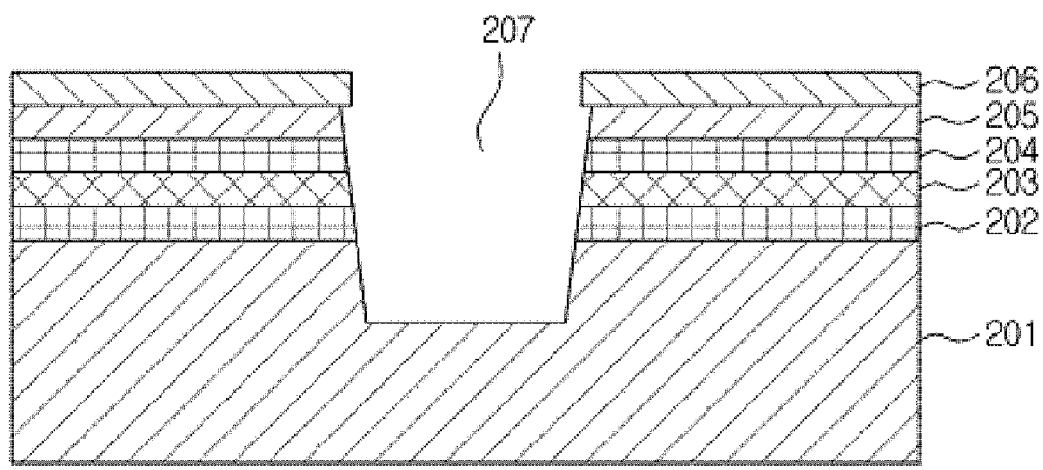

Thereafter, as shown in FIG. 3, a nitride film 206 is formed on the 205. The nitride film 206 is etched through patterning. The P-N-P layer 204, 203, and 202 and a part of the substrate SiO2 201 are etched by the etching of the oxide film 205 and silicon (207).

Figure 4:
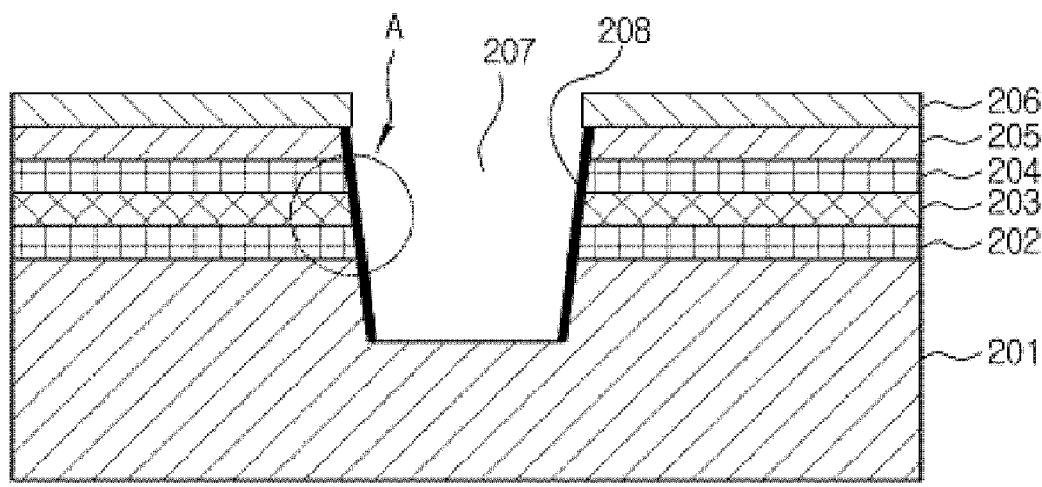
Figure 6:
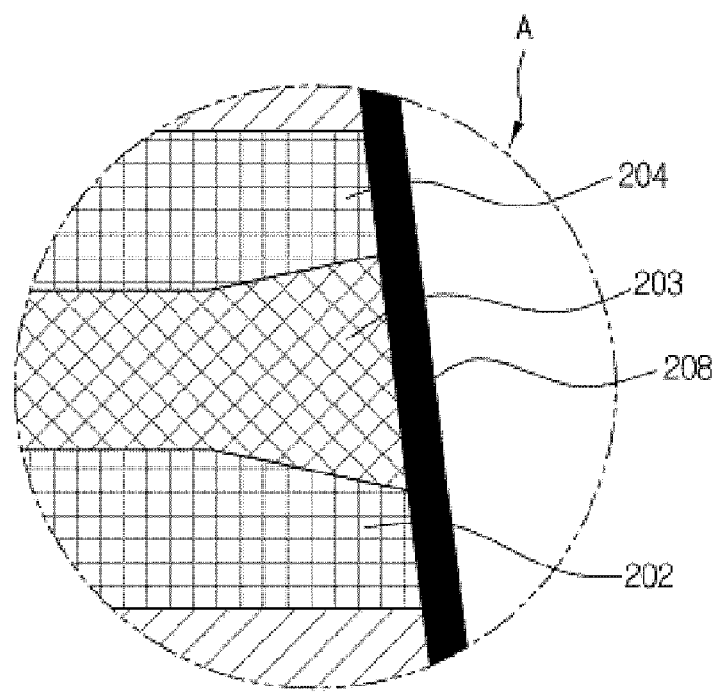

Referring to FIG. 4, a thermal treatment (for example, 900 degrees and H ambient) process is performed to form a sidewall oxide film 208 on etched sidewalls of the P-N-P layer. That is, as shown in FIG. 6, the sidewall oxide film 208 is formed on the side of the P-N-P layer and the P-N-P layer is shown with diffusion from the oxide growth.

Figure 5:
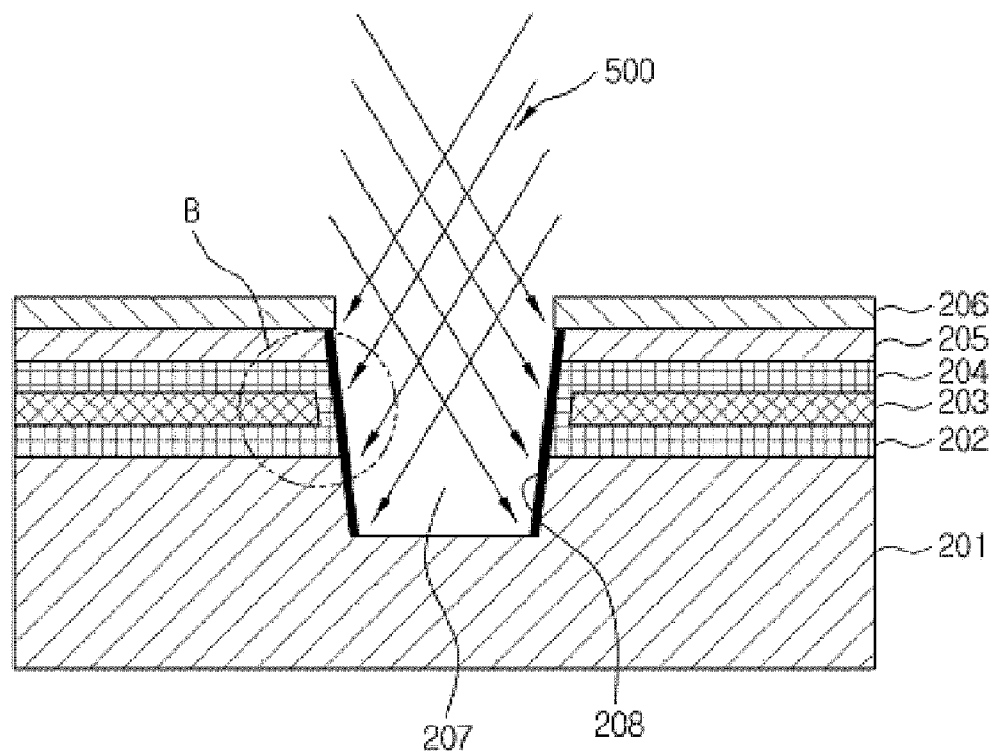
Figure 7:
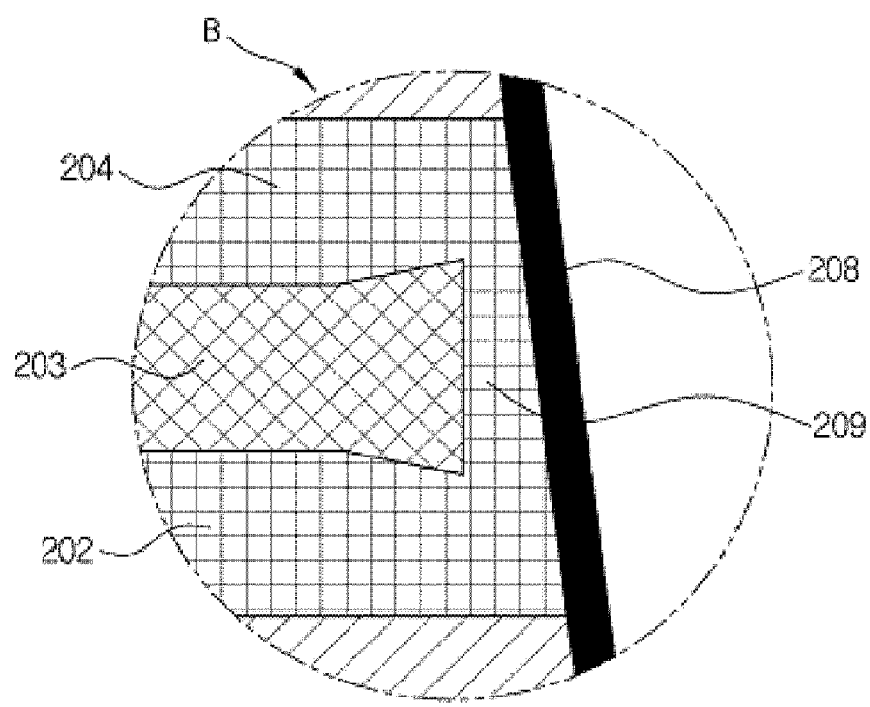

Referring to FIG. 5, a trivalent element, such as boron (B), is implanted (500) on the sidewalls of the groove in which the sidewall oxide film 208 is formed, thus forming a P sidewall layer 209 in which the upper and lower P layers of the P-N-P layer are connected within the sidewall oxide film 208, as shown in FIG. 7.

If the PNP layer doping is adjusted properly, depletion occurs at voltage bias in the N layer, resulting in a photodiode of a pinned nature.

Furthermore, FIGS. 8 to 13 illustrate another technique of forming the buried diode. The techniques illustrated in FIGS. 8 to 13 are the same as those of FIGS. 2 to 7, but use an N-P-N layer instead of the P-N-P layer.

Figure 8:
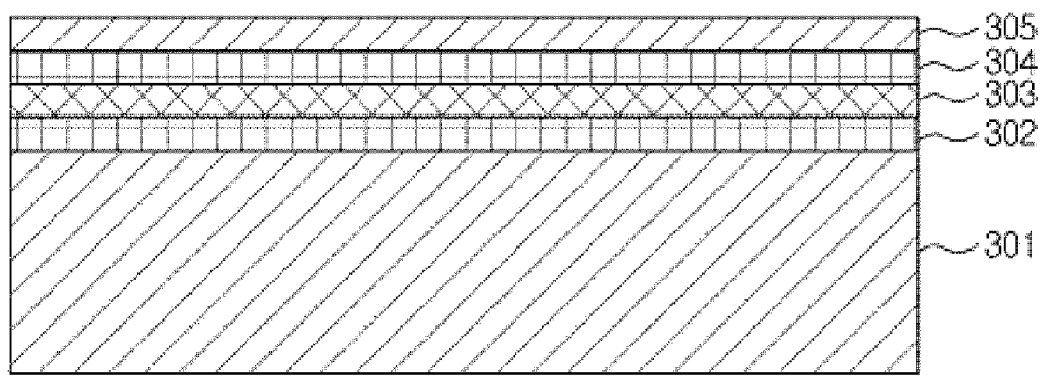
FIGS. 8 to 13 are cross-sectional views illustrating a method of fabricating an N-P-N type photodiode according to an embodiment of the present invention.

Referring first to FIG. 8, a N-type Si layer 302, a P-type Si layer 303, and a N-type Si layer 304 are sequentially formed on a substrate 301 (SiO2 as a BOX layer on a substrate) by P doping, B doping, and P doping, respectively. An oxide film 305 is formed on the N-type Si layer 304.

Figure 9:
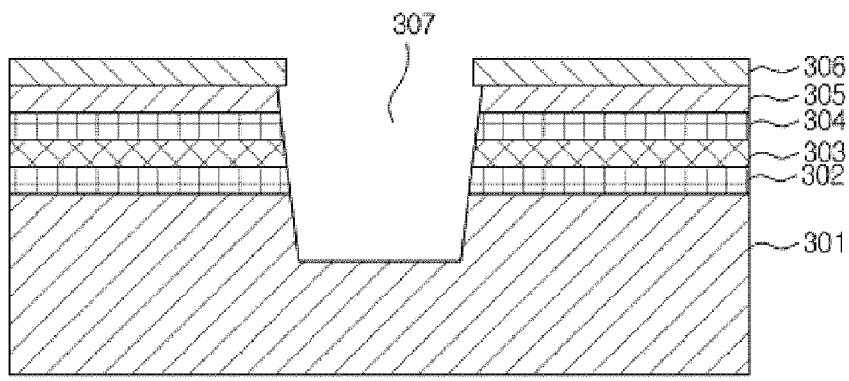

Referring to FIG. 9, a nitride film 306 is formed on the oxide film 305. The nitride film 306, the N-P-N layer 304, 303, and 302, and a part of the substrate 301 are etched through patterning, thus forming a contact groove 307.

Figure 10:
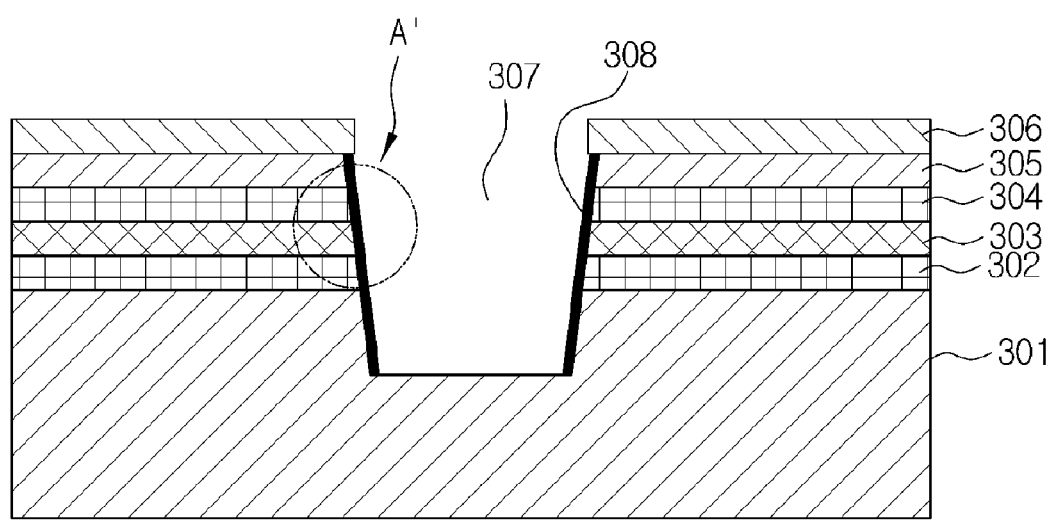

Referring to FIG. 10, a thermal treatment process is performed and sidewall oxide film 308 is formed on the sidewalls of the contact groove 307. A pentavalent element, such as phosphor (P), is implanted to form a sidewall N layer 309 in which the upper and lower N layers 304, 302 are interconnected within the sidewall oxide film 308 to bury the P layer 303, thereby completing a buried structure.

Figure 11:
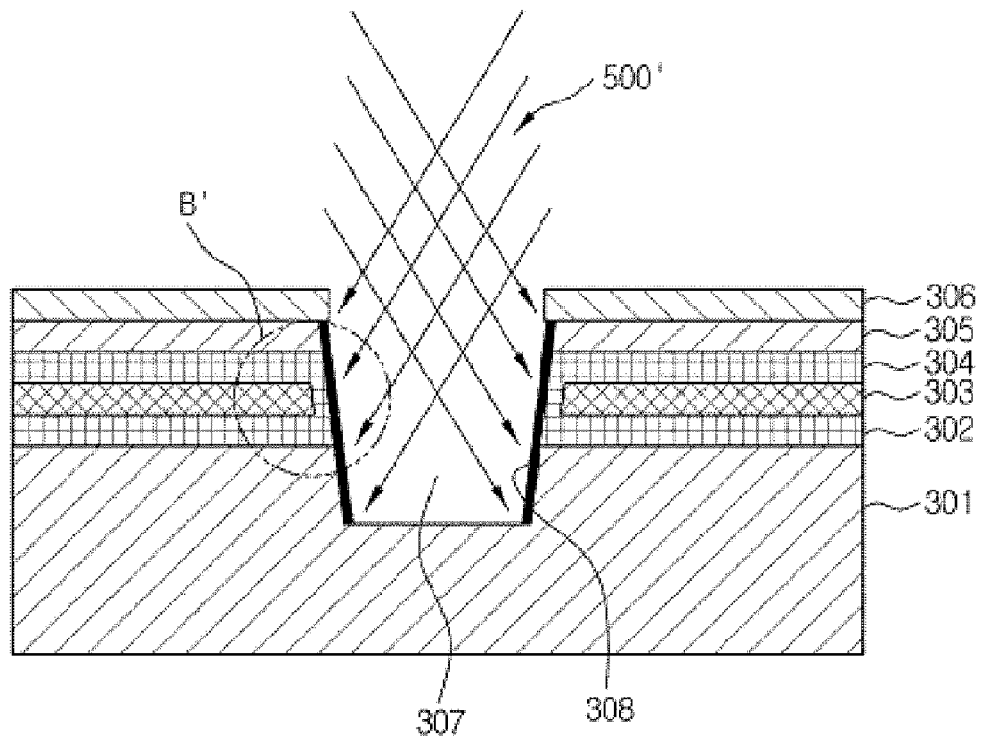
Figure 12:
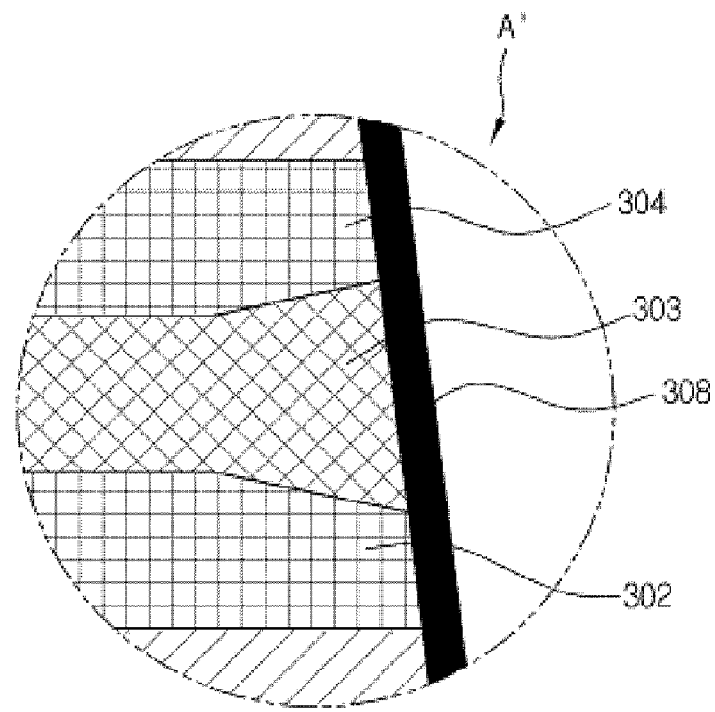
Figure 13:
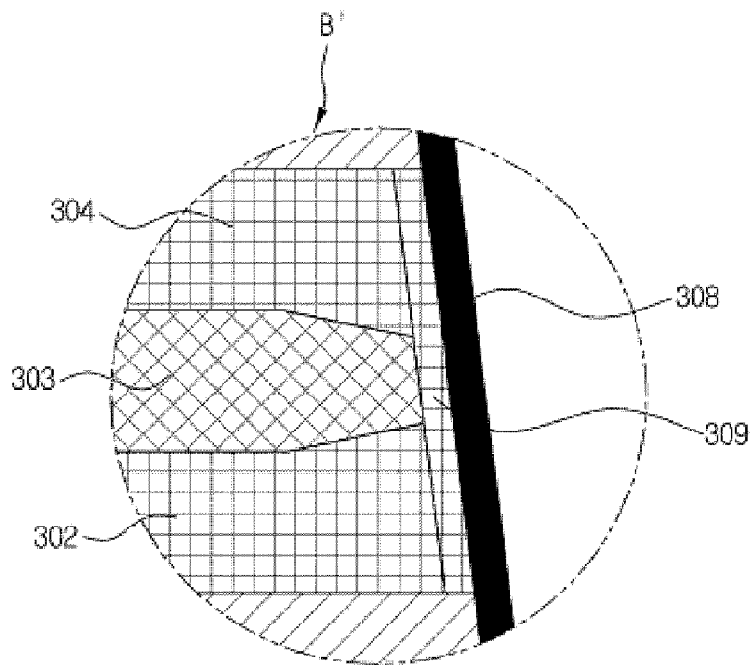

FIG. 12 is a detailed view of a structure in which the sidewall oxide film 308 of FIG. 10 is formed and FIG. 13 is a detailed view of a structure in which the sidewall N layer 309 is formed adjacent to the sidewall oxide film 308 of FIG. 11. In the N-P-N type, if a NPN layer is subsequently doped appropriately at voltage bias depletion occurs in the P layer, resulting in a photodiode of a pinned nature.

This technique may be applied to a case where a NPN or PNP photodiode is laminated in several layers in the same manner. With the trenching and isolation (burying implant) formed in one operation.

<Formation of Pixel Separation Trench>

FIGS. 14 to 17 are explanatory views illustrating pixel isolation of an image sensor device of a multi-layer structure according to an embodiment of the present invention.

Figure 14:
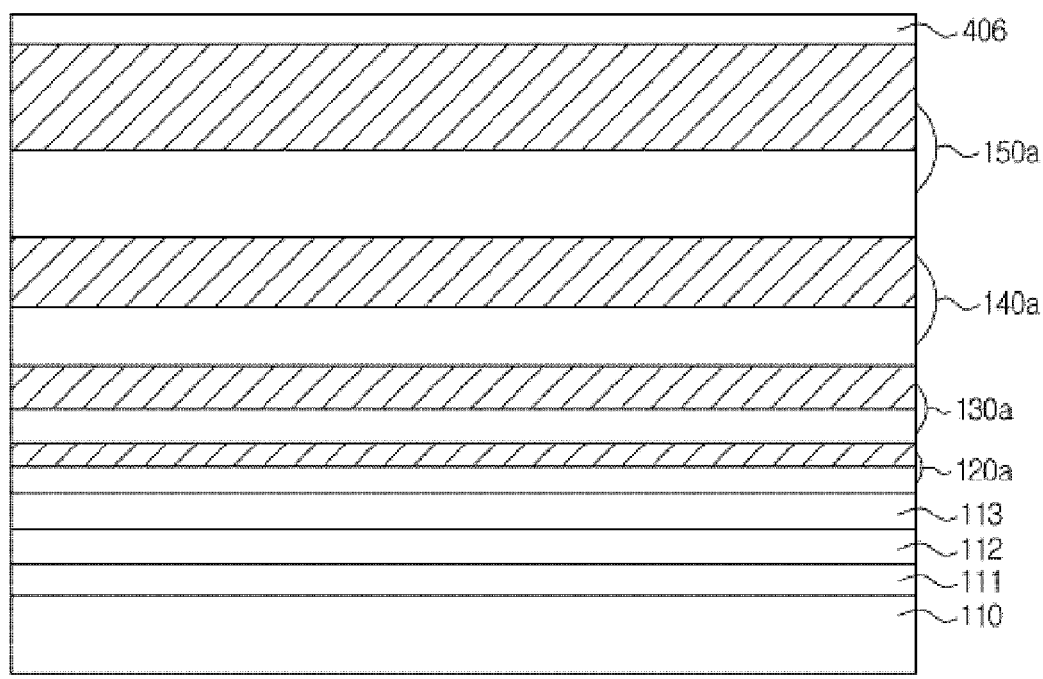

Referring to first FIG. 14, a plurality of photodiodes and transistor layers 120a to 150a are laminated on a substrate. A photoresist layer 406 for etching is formed on the transistor layer 150a. An isolation type trench groove 401 begins processing.

Figure 15:
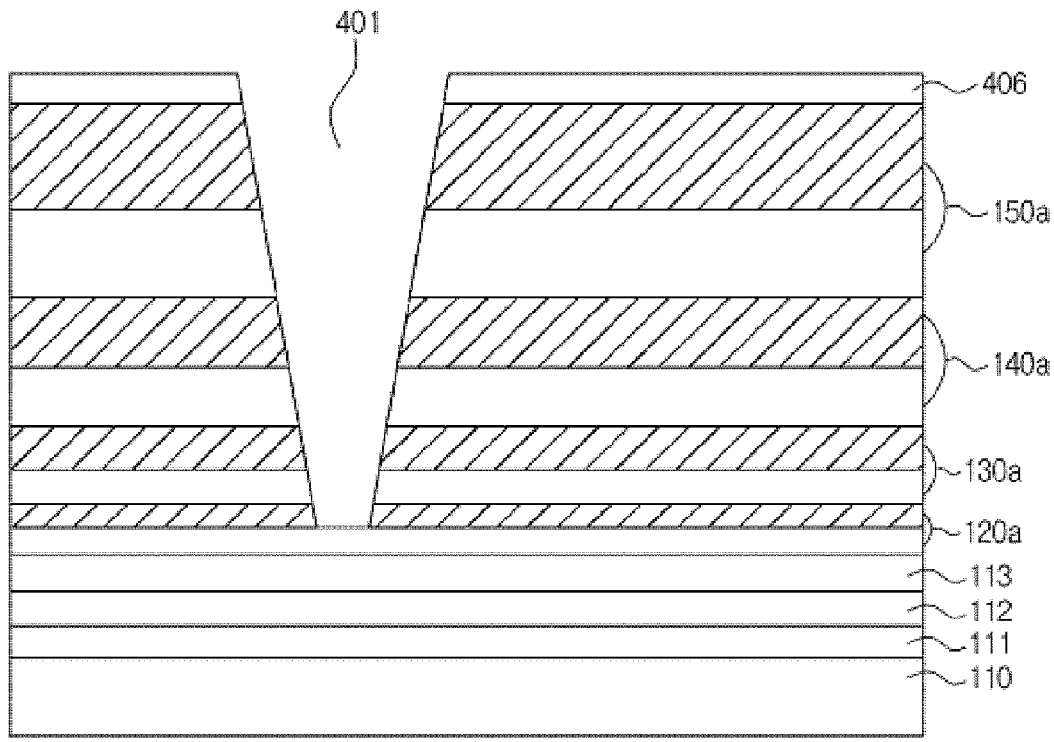

Referring to FIG. 15, the trench 401 is formed from the transistor layer 150a of the highest layer to the blue photodiode layer 120a.

On a plane layer of the substrate on which an isolation process has been completed separated pixels are divided into square pixels in which D-shaped pixels are consecutively arranged in a regular repeating manner. However, the shape may be circular or other polygonal shapes.

Alternatively, as shown in FIG. 16, to further increase the fill factor, up to the upper oxide film of the blue photodiode 120a may be partially etched.

Referring to FIG. 17, after the trench groove 401 is formed as shown in FIG. 15 or 16; an insulating layer 402 is formed on the sidewalls of the trench groove 401. The insulating layer 402 may be formed of an oxide film. Upper and lower conductive materials of the photodiode are doped (405) into the insulating layer 402 for the purpose of the buried structure of the photodiode layer within the insulating layer 402.

In other words, in the case where an N-P-N type photodiode is laminated, a P-type material (i.e., the upper and lower layers) is doped to form a P sidewall layer. If the buried process of the photodiode is completed, the remaining space 401 is filled with an insulator 409, thus minimizing the effect of a subsequent process.

The photodiode may be implemented using a circuit capable of eliminating noise or attenuating kTC noise using the pinned technique. To this end, in a PNP or NPN type photodiode structure, it is required to define a doping region and a doping level in which a region doped with an N type is completely depleted at voltage bias. In doing so, capacitance at this portion becomes zero. Therefore, kTC noise does not exist since the capacitance has vanished.

<Example of Formed Contact>

The last process of making the photodiode into the photo sensor is to connect each photodiode to the transistor detection circuit. It is necessary to connect both anode and cathode of the photodiode. In this connection process contact, a technique similar to the isolation type trench groove method used in inter-pixel isolation is used. The trench groove is drilled using silicon of the photodiode layer as etch stop and implant is then performed to form a contact while doping a part of Si at the region.

If a dopant has the same physical property as that of an outer portion 402 of the diode, the outer portion is filled with a conductor, such as metal, and is thus connected.

If the dopant is the same as an inner portion 401 of the diode (a P or N layer accumulated therein), the outer portion 402 is counter-doped and the inner portion 401 is filled with a conductor, such as metal, and is thus connected. The contact has a structure similar to that of a contact for an S/D electrode of a transistor.

To form the contact type trench groove, the isolation type trench groove begins processing in a state where the plurality of photodiodes and transistor layers 120a to 150a are laminated on the substrate and the photoresist layer 406 for etching is formed on the transistor layer 150a as shown in FIG. 14.

Referring to FIG. 18, if drilling up to a desired depth is completed, the sidewalls are coated with the insulating layer 402 and doping 405 for the buried diode is performed. The upper and lower conductive materials of the photodiode layer are interconnected by the doping 405, forming the upper and lower conductive material sidewall layers in which the conductive material at the center is formed in a buried shape.

Referring to FIG. 19, a contact 403 is formed using an implant scheme so that the Si layer at the bottom can become conductive to a desired diode polarity. The groove 401 is then filled with a conductive conductor 407. If the contact formed as described above is commonly connected to the diode layer formed in three dimensions (for example, a ground line), the groove 401 may be filled with the conductor 407 immediately after the doping 405 without using the insulating layer 402, as shown in FIG. 20.

In this manner, the contact for the diode and the transistor of the multilayer structure is formed and then connected to the circuit of the metal layer.

INDUSTRIAL APPLICABILITY

In accordance with the present invention, a diode layer or multiple diode layers and a transistor layer are laminated by layer transfer and a photodiode for an image sensor is formed. Therefore, the present invention is advantageous in that it can provide a photodiode that can be laminated, has a low leakage current, can have a buried and pinned structure, and has a high fill factor.

Furthermore, a multiple spectral photonic image sensor according to the present invention is advantageous in that it can detect several wavelength bands at one pixel location, can control wavelength bands individually, can minimize the leakage current at an optical detection location, can eliminate kTC noise, can optimize the fill factor of individually sensed pixel, and can maximize an area for implementing a signal processing circuit.

It should be noted that the disclosure is not limited to the embodiment described and illustrated as examples. A large variety of modifications have been described and more are part of the knowledge of the person skilled in the art. These and further modifications as well as any replacement by technical equivalents may be added to the description and figures, without leaving the scope of the protection of the disclosure and of the present patent.

What is claimed is:

1. A pixel isolation and contact structure of a photodiode of a three-dimensional multi-layer image sensor in which a lower first conductive type material, a second conductive type material, and an upper first conductive type material are sequentially doped into silicon, forming one photodiode layer, the photodiode layer comprises one or more layers, and a transistor layer is formed at the highest layer or the lowest layer, the pixel isolation and contact structure comprises:

an isolation type trench groove formed for pixel isolation;
a plurality of contact type trench grooves respectively formed to a predetermined depth in order to connect circuits of photodiodes of each layer and the transistor layer;
a sidewall insulating layer formed on sidewalls of the isolation type trench grooves and the contact type trench grooves;
a first conductive type material sidewall layer formed within the sidewall insulating layer and having a structure in which the upper and lower first conductive type materials are interconnected to bury the second conductive type material;

an insulating layer filled into the isolation type trench groove;

a contact doped on a bottom surface of the contact type trench groove, for electrical connection with a corresponding photodiode;

a conductive material filled into the contact type trench grooves; and a photodiode of a pinned structure formed in both directions of the second conductive type material through a thermal treatment process.

2. The pixel isolation and contact structure of claim 1, wherein in the case where the contact type trench grooves and the isolation type trench groove include a multi-layer photodiode, only the first conductive type material sidewall layer is formed.

3. A photodiode in which a lower first conductive type material layer—a second conductive type material layer—an upper first conductive type material layer are sequentially formed on a substrate, forming a diode layer, an isolation type trench groove is formed to isolate pixels, and a contact type trench groove is formed, the photodiode comprising:

a sidewall oxide film formed on sidewalls in such a way to surround the diode layer exposed by the isolation type trench groove and the contact type trench groove; and a first conductive type material sidewall layer in which the upper and lower first conductive type material layers are interconnected by ion implant into the sidewall oxide film, thus burying the second conductive type material layer.

4. A buried type photodiode of a three-dimensional multi-layer image sensor in which a multi-layer photodiode layer and a transistor layer at the outermost layer are formed, wherein a lower first conductive type material, a second conductive type material, and an upper first conductive type material are sequentially doped into silicon, forming one photo diode layer; and each photodiode layer comprises:

a sidewall insulating layer formed on sidewalls of a trench groove for pixel isolation and contact; and a first conductive type material sidewall layer in which the upper and lower first conductive type materials are interconnected to bury the second conductive type material within the insulating layer.

5. A buried type photodiode of a three-dimensional multi-layer image sensor in which a multi-layer photodiode layer and a transistor layer at the highest layer or the lowest layer are formed, wherein the multi-layer photodiode layer comprises a mixed diode layer in which a first photodiode layer in which a lower first conductive type material, a second conductive type material, and an upper first conductive type material are sequentially doped into silicon, and a second photodiode layer in which a lower second conductive type material, a first conductive type material, and an upper second conductive type material are sequentially doped into silicon are mixed and laminated; and each photodiode layer comprises:

a sidewall insulating layer formed on sidewalls of a trench groove for pixel isolation and a trench groove for contact; and upper and lower conductive type material sidewall layers in which the upper and lower first conductive type materials are interconnected to bury the second conductive type material that is disposed between the upper and lower first conductive type materials within the insulating layer, and the upper and lower second conductive type materials are interconnected to bury the first conductive type material that is disposed between the upper and lower second conductive type materials within the insulating layer.

* * * * *